United States Patent
Graumann et al.

(10) Patent No.: US 9,602,133 B1
(45) Date of Patent: Mar. 21, 2017

(54) SYSTEM AND METHOD FOR BOOST FLOOR MITIGATION

(71) Applicant: PMC-SIERRA US, INC., Sunnyvale, CA (US)

(72) Inventors: Peter Graumann, Calgary (CA); Sean G. Gibb, Calgary (CA)

(73) Assignee: Microsemi Storage Solutions (U.S.), Inc., Aliso Viejo, CA (US)

(*) Notice: Subject to any disclaimer, the term of this patent is extended or adjusted under 35 U.S.C. 154(b) by 35 days.

(21) Appl. No.: 14/606,579

(22) Filed: Jan. 27, 2015

(51) Int. Cl.
*H03M 13/00* (2006.01)
*H03M 13/11* (2006.01)

(52) U.S. Cl.
CPC ...... *H03M 13/1125* (2013.01); *H03M 13/114* (2013.01)

(58) Field of Classification Search
CPC .......... H03M 13/1111; H03M 13/1137; H03M 13/114; H03M 13/11; H03M 13/09; H03M 13/27; H03M 13/1125; H04L 1/0057; H04L 1/0041; H04L 1/0061; G11B 20/1833; G11B 2020/185
See application file for complete search history.

(56) References Cited

U.S. PATENT DOCUMENTS

| | | | |
|---|---|---|---|
| 8,448,039 B2 | 5/2013 | Gunnam | |
| 8,504,895 B2 | 8/2013 | Sharon et al. | |
| 8,689,084 B1 | 4/2014 | Tai | |
| 8,700,976 B2 | 4/2014 | Gunnam et al. | |
| 9,325,347 B1* | 4/2016 | Graumann | ......... H03M 13/1111 |
| 2009/0319860 A1 | 12/2009 | Sharon et al. | |

FOREIGN PATENT DOCUMENTS

WO    2009156883 A1    12/2009

* cited by examiner

*Primary Examiner* — Guerrier Merant
(74) *Attorney, Agent, or Firm* — Dennis R. Haszko (57) ABSTRACT

A method for boost floor mitigation during a decoding operation performed by a decoder is disclosed herein. The method includes: monitoring for a floor error condition while performing the decoding operation; if a floor error condition has been detected, then: clearing a feedback delay memory in the decoder; downscaling main memory values in the decoder; applying a gain in low-rank columns; and continuing to perform the decoding operation.

15 Claims, 11 Drawing Sheets

FIG. 1

WiMax

G.hn

Lower Triangular

SYSTEM AND METHOD FOR BOOST FLOOR MITIGATION

FIELD

The present disclosure relates generally to error correcting codes. More particularly, the present disclosure relates to forward error correcting decoder methods.

BACKGROUND

Error detection and correction techniques are used to reliably transmit information over unreliable channels. Such techniques are used in a variety of systems including telecommunications systems and data storage devices. An example of such a technique is forward error correction in which the sender of information encodes the information in a redundant manner using an error-correcting code. At the receiver end the message is then decoded. The redundancy allows the receiver to detect and correct a limited number of errors in the message. Improvements in error correction are desirable.

SUMMARY

In a first aspect, the present disclosure provides an Error Correction Code (ECC) decoder including at least one processor. The at least one processor comprises: a detection element for detecting a floor error condition; a check node circuit element; a delay element coupled in a feedback loop with the check node element; a first gain element coupled to an output of the check node element, the gain element being enabled when the detection element has detected a floor error condition; a feedback clearing element coupled to the delay element, the feedback clearing element configured to clear the delay element when a floor error condition has been detected; and a Log Likelihood Ratio (LLR) scaling device to scale down a current LLR state in a FEC block.

In an embodiment, the processor could be a layered processor.

In general, various embodiments disclosed herein relate to LDPC decoders, including flood filling LDPC decoders, as well as other iterative decoders that have a mix of higher and lower degree columns.

In an embodiment, the ECC code is a Low Density Parity Check (LPDC) code.

In an embodiment, the decoder further comprises: a codeword memory element for storing a full FEC block to be processed; a plurality of shift processors for performing a circulant shift operation specified by an H matrix; wherein the at least one layered processor comprises a plurality of layered processors, each layered processor further comprising: a port for receiving a value from a column in the H matrix; a subtractor coupled to the port, the subtractor configured to remove previous extrinsic information for a layer from a value received from the H matrix, an output of the subtractor being coupled to an input of the check node circuit element; an adder for combining the check node input and an output of the check node; wherein the delay element stores the check node output for use in a subsequent iteration.

In an embodiment, the first gain element is coupled between the output of the check node element and an input of the adder; and an input of the delay element is coupled to an output of the first gain element.

In an embodiment, the first gain element is coupled between the output of the check node element and an input of the adder; and wherein an input of the delay element is coupled to the output of the check node element.

In an embodiment, the decoder further comprises a second gain element between an output of the delay element and an input of the subtractor.

In an embodiment, the first gain element is enabled only for low rank columns of the H matrix, a low rank column being a column having a weight of 2 or less.

In an embodiment, the detection element is configured to: count the number of failing check nodes; when the number of failing check nodes falls below a first threshold, count the number of consecutive layers the failing checknodes are below the first threshold; and determine that a floor error condition has occurred when the number of counted consecutive layers are above a second threshold.

In a further embodiment, there is provided a method for boost floor mitigation during a decoding operation performed by a decoder, the method comprising: monitoring for a floor error condition while performing the decoding operation; if a floor error condition has been detected, then: clearing a feedback delay memory in the decoder; downscaling main memory values in the decoder; applying a gain in low-rank columns; and continuing to perform the decoding operation.

In an embodiment, the decoding operation is an Error Correction Code (ECC) decoding operation.

In an embodiment, the ECC code comprises a Low Density Parity Check (LPDC) code.

In an embodiment, monitoring for a floor error condition comprises: counting the number of failing check nodes; when the number of failing check nodes falls below a first threshold, counting the number of consecutive layers the failing checknodes are below the first threshold; and determining that a floor error condition has occurred when the number of counted consecutive layers are above a second threshold.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

DETAILED DESCRIPTION

Various embodiments described herein can be deployed in communication systems that include iterative decoders. Examples of iterative decoders include decoders that employ iterative FEC (Forward Error Correction) algorithms including, but not limited to, LDPC (low-density parity-check) codes. Some of the embodiments disclosed herein can be particularly useful in situations where the error floor requirements of a given system are very low or are simply lower than the error floor of a given H matrix. Various of the embodiments described herein can be implemented as an Application Specific Integrated Circuit (ASIC). Other implementations are also possible.

Embodiments disclosed herein can be employed in systems such as, but not limited to: Optic Fiber based Metro and Wide Area Networks (MANs and WANs), as well as the Physical Layer of Flash memory.

Various embodiments disclosed herein relate to a novel modification to iterative FEC (Forward Error Correction) decoder methods that can improve FER (Frame Error Rate) performance in the error floor region. Many iterative FEC algorithms, such as commonly used LDPC (low-density parity-check) decoders, have error floors where the performance of the decoder does not improve below a certain threshold. Error Floors can be caused by arithmetic limitations within practical LDPC decoder implementations. Some H matrix structures are particularly susceptible to such Numerically Induced Floors (NIFs). Boost floor mitigation efficiently corrects NIFs while maintaining good FEC performance.

Some of the embodiments disclosed herein relate to methods that can be employed within any iterative decoding process. The description of many of the embodiments will focus on LDPC codes but systems and methods in accordance with the present disclosure could also be employed for other types of decoder, such as, for example, Turbo Decoders.

LDPC codes, originally proposed by Robert Gallager in his doctoral dissertation in 1963 ("Low-Density Parity-Check Codes", Monograph, MIT Press, 1963, herein after "Gallager", incorporated herein by reference in its entirety), are current generation iterative soft-input FEC decoders that have found increasing popularity in FEC applications where low error floor and high performance are desired. LDPC decoders are defined in terms of a two-dimensional matrix, referred to as the H matrix, which describes the connections between the data and the parity. The low-density H matrix is representable as a sparse bipartite graph, known as a Tanner graph, with 1s in the matrix describing a valid edge connection between a variable node and a check node in the graph (see e.g. Channel Codes: Classical and Modern, W. Ryan and S. Lin, Cambridge University Press, 2009, herein after "Ryan et al.", incorporated herein by reference in its entirety). An H matrix can take the form shown in Table 1 below.

TABLE 1

A Sample LDPC H Matrix

| | $D_1$ | $D_2$ | $D_3$ | ... | $D_{N-1}$ | $D_N$ | $P_1$ | $P_2$ | ... | $P_{M-1}$ | $P_M$ |
|---|---|---|---|---|---|---|---|---|---|---|---|
| $R_1$ | 1 | 0 | 0 | | 1 | 0 | 1 | 1 | | 1 | 1 |
| $R_2$ | 0 | 1 | 0 | | 1 | 1 | 0 | 0 | | 1 | 0 |
| $R_3$ | 1 | 0 | 1 | | 0 | 0 | 0 | 0 | | 0 | 1 |
| ... | | | | | | | | | | | |
| $R_{M-1}$ | 0 | 0 | 1 | | 0 | 0 | 1 | 1 | | 0 | 0 |
| $R_M$ | 0 | 1 | 0 | | 1 | 0 | 0 | 1 | | 0 | 1 |

The N input data bits, $D_1 \ldots D_N$, are passed into the matrix one per column. The M parity equations are chosen such that all rows have even parity and the H matrix has one row per parity column. The rate of an LDPC code is defined as the input data rate versus the output data rate of an LDPC encoder and is specified by the formula:

$$R = \frac{N}{N + M}$$

Decoding LDPC codes is an NP-complete optimization problem that is solved based on a two-step iterative algorithm that approximates a belief propagation algorithm. The following brief description of LDPC decoding focuses on the flood-filling method of LDPC decoding. Various embodiments, disclosed herein apply to flood-filling LDPC decoders. However, it should be understood that various embodiments disclosed herein also apply to other LDPC decoders as well as other iterative decoders that are not LDPC decoders. The LDPC decoder is initialized by N+M soft-values (such as log-likelihood ratios) from the channel which are loaded into N+M variable nodes. In the first half-iteration, the check nodes take the output of the neighboring variable nodes and calculate an output for neighboring variable nodes. A common algorithm, due to implementation complexity, for calculating the check node out is the min-sum algorithm. In the min-sum algorithm, the magnitude of the check node outputs is calculated by determining the minimum magnitude of all active neighboring variable node outputs and the sign is the one-bit binary multiplication of all neighboring variable node output signs. The check node output is extrinsic information, that is, it does not contain any information about its channel. In the second half-iteration, N+M variable nodes calculate the summation of the channel information and the extrinsic information of the neighboring check nodes to produce an output that will be used by neighboring check nodes in the next iteration. Decoding continues until the code converges or has reached a specified maximum number of iterations.

Implementing a solution with an H matrix with an arbitrary placement of 1s is difficult. As a result, a subclass of LDPC codes known as Quasi-Cyclic (QC) Codes is typically implemented. The H matrix of a QC LDPC code is represented as an array of Q×Q circulant matrices as demonstrated in Table 1.

TABLE 1

A Sample QC-LDPC H Matrix

| | $C_{D1}$ | $C_{D2}$ | $C_{D3}$ | $C_{D4}$ | $C_{D5}$ | $C_{P1}$ | $C_{P2}$ | $C_{P3}$ | $C_{P4}$ | $C_{P5}$ | $C_{P6}$ |
|---|---|---|---|---|---|---|---|---|---|---|---|
| $R_1$ | 7 | -1 | -1 | -1 | -1 | 11 | -1 | -1 | -1 | -1 | 1 |
| $R_2$ | -1 | 3 | -1 | -1 | -1 | -1 | 2 | -1 | -1 | 2 | -1 |
| $R_3$ | -1 | -1 | -1 | 0 | -1 | -1 | -1 | 15 | -1 | -1 | -1 |

TABLE 1-continued

A Sample QC-LDPC H Matrix

|     | $C_{D1}$ | $C_{D2}$ | $C_{D3}$ | $C_{D4}$ | $C_{D5}$ | $C_{P1}$ | $C_{P2}$ | $C_{P3}$ | $C_{P4}$ | $C_{P5}$ | $C_{P6}$ |
| --- | --- | --- | --- | --- | --- | --- | --- | --- | --- | --- | --- |
| $R_4$ | −1 | −1 | 12 | −1 | 4 | −1 | −1 | −1 | 14 | −1 | −1 |
| $R_5$ | 10 | −1 | 2 | −1 | 5 | −1 | −1 | 11 | −1 | −1 | 0 |
| $R_6$ | −1 | 3 | −1 | 4 | −1 | 9 | 6 | −1 | 8 | 4 | −1 |

When an array entry $A_{R,C}$ contains a −1, the Q×Q matrix is an all-zero matrix. Entries that are ≥0 are commonly treated as the rotation of an identity matrix by the specified amount. For example for an H matrix with Q=8 and an $A_{R,C}$=4 the circulant matrix would be:

TABLE 2

Sample Circulant Matrix

| 0 | 0 | 0 | 0 | 1 | 0 | 0 | 0 |
| --- | --- | --- | --- | --- | --- | --- | --- |
| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 |
| 1 | 0 | 0 | 0 | 0 | 0 | 0 | 0 |
| 0 | 1 | 0 | 0 | 0 | 0 | 0 | 0 |
| 0 | 0 | 1 | 0 | 0 | 0 | 0 | 0 |
| 0 | 0 | 0 | 1 | 0 | 0 | 0 | 0 |

Note that each row and column in the circulant matrix has a weight of one (hereinafter denoted as weight-1), that is, it contains only a single 1 in each row and column. This feature of a QC-LDPC H matrix makes implementing the encoder and decoder significantly easier than a random LDPC H matrix. In some cases it is desirable to define a QC-LDPC H matrix where rows are orthogonal to each other. An orthogonal H matrix is one where two or more rows do not have any common columns with weight-1 circulant matrices. In Table 2, it can be observed that rows $R_1$, $R_2$, $R_3$ and $R_4$ are orthogonal since they do not have any columns that have more than a single weight-1 circulant matrix. Similarly rows $R_5$ and $R_6$ are also orthogonal. A layer can be a single row, or a combination of two or more orthogonal rows.

Figure 1:
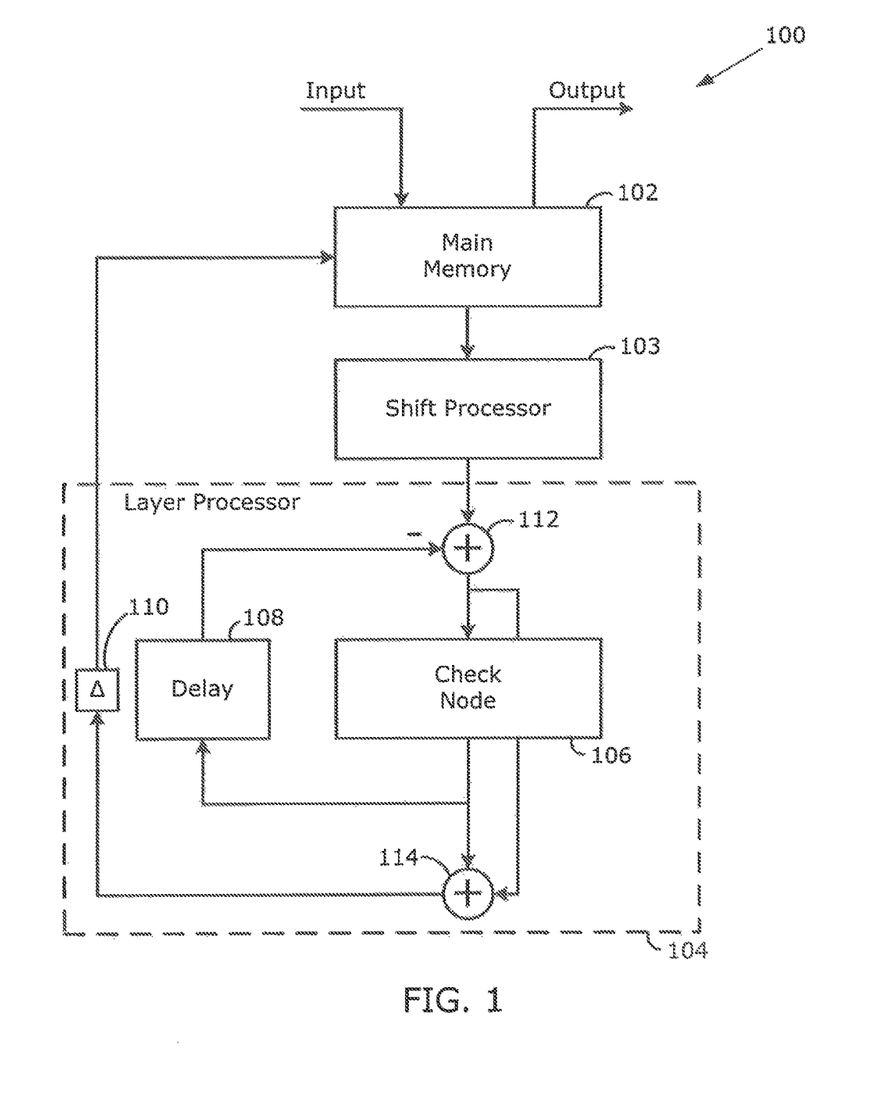
FIG. 1 is a block diagram of an LDPC (low-density parity-check) decoder.

Reference is made to FIG. 1, which is a block diagram illustrates a LDPC decoder 100 utilized for performing the LDPC decoding process. LDPC decoder 100 includes a main memory 102, a shift processor 103, and a layer processor 104. Layer processor 104 includes a check node 106, delay element 108, and a delay element 110. As can be seen from FIG. 1, the results of the operation are written back to main memory 102 through delay element 110 some clock cycles after the operation has been completed. In some embodiments, delay element 110 is not a physical component. In such embodiments, delay element 110 illustrated in FIG. 1 represents the delay that occurs as a result of various processing steps, which require time. It is illustrated as a physical element to indicate that the results are written back to main memory 102 after some delay. The decoder also includes two adders 112 and 114.

Noisy data arrives from the channel, as soft information, to the decoder 100 and is typically routed to the Main Memory 102 in a manner that avoids pipeline stalls. The Main Memory 102 is comprised of a plurality of memory elements where each memory element is a two-port memory supporting one write and one read per clock cycle. Typically these memories will be implemented as two-port register files. Shift processor 103 implements the finer details of the H matrix as described in Table 2. For example, shift processor 103 selects the correct bits at every input such that the information is processed correctly at the layer processor. In various embodiments, there is a shift processor instance per column in the H matrix of the LDPC code. A plurality of Layer Processors 104 is connected to the Main Memory 102 through shift processor 103. In an embodiment, each Layer Processor 104 operates in parallel with the other Layer Processors 104. The first adder 112 in the Layer Processor removes the extrinsic information for the layer in the H matrix currently being operated on. In an embodiment, the output of adder 112 comprises channel and extrinsic information from all of the other check nodes that are connected to each of the plurality of layer values generated by adder 112. The check node 106 performs an approximation of the belief propagation algorithm such as the minsum algorithm. The adder 114 at the bottom combines the extrinsic information generated by the check node 106 with the channel information and provides it to the Main Memory 102 for storage for the next update. The Delay element 108 feeds back the extrinsic information for the processing in the next iteration. The Layer Processors 104 are the dominant source of processing and power consumption in the LDPC decoder 100. The iterative decode process proceeds based on the specified H matrix until the decode process has completed either by converging to a solution or running out of processing time.

For many practical LDPC H matrices there is a disparity between the column weights present in the data portion versus those present in the parity portion. In general, the column weight in the data section is at least four. The degrees of freedom available in code design for the data columns is very high allowing code designers to choose the best performing column order or collections of column order. For good operation it is generally accepted that at least 4 entries in any given H matrix column leads to good error correction performance versus implementation complexity trade off; any lower and FER and floor performance of the code is impacted while higher order column weights lead to more complexity in exchange for the error correction performance increase.

Figure 2:
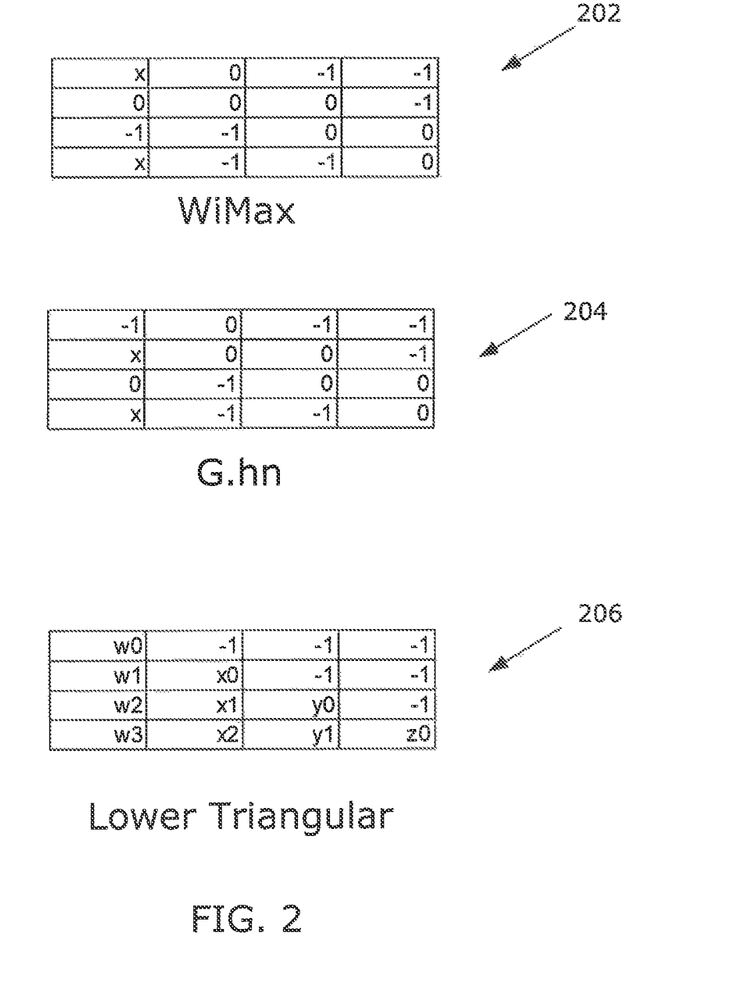
FIG. 2 is a diagram illustrating parity section H matrices.

Unlike the data columns, the parity columns of an LDPC H matrix often come with the additional constraint that they must be invertible. An invertible parity section leads to power and area efficient LDPC Encoder designs and while codes without this constraint can be designed and implemented, they are implemented at the expense of significantly increased Encoder complexity. The vast majority of codes used in industry (WiMax, G.hn, etc) employ parity sections that can be inverted and many of these standards (Moca, Wigig etc) further employ a lower-triangular parity matrix particularly due to the resulting Encoder simplicity. For reference, some standard based parity sections are shown in FIG. 2. Specifically, FIG. 2 illustrates the WiMax 202, G.hn 204, and Lower Triangle 206, parity sections.

The above-described invertibility constraint has the side-effect of forcing multiple parity columns to have a lower column weight than the data columns for a given H matrix. For instance, in a column weight 4 H matrix the lower triangular parity matrix is column weight 4 through column weight 1. In the case of the WiMax and G.hn parity matrix formulations all of the parity columns are lower column weight than the data columns in the H matrix though there are no column weight 1 parity columns.

Figure 3:
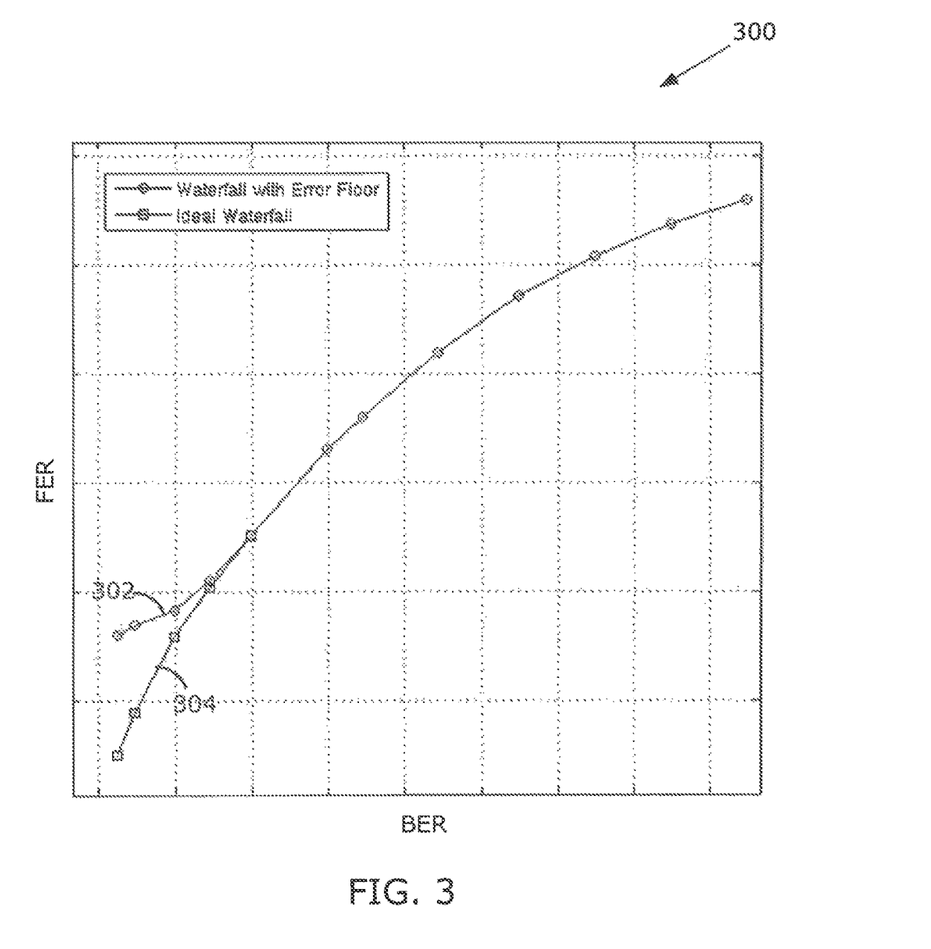
FIG. 3 is a graph illustrating decoder performance.

A problem with LDPC codes is that they typically have a frame error rate (FER) error floor as illustrated in FIG. 3. In the example graph 300 shown in FIG. 3, the FER performance curve 302 of the decoder follows the ideal waterfall performance curve 304 until the error floor region of the code is approached. At this point decoder performance begins to diverge from ideal, eventually reaching a condition where the FER performance only improves slowly as the input bit error rate (BER) is reduced.

Figure 4:
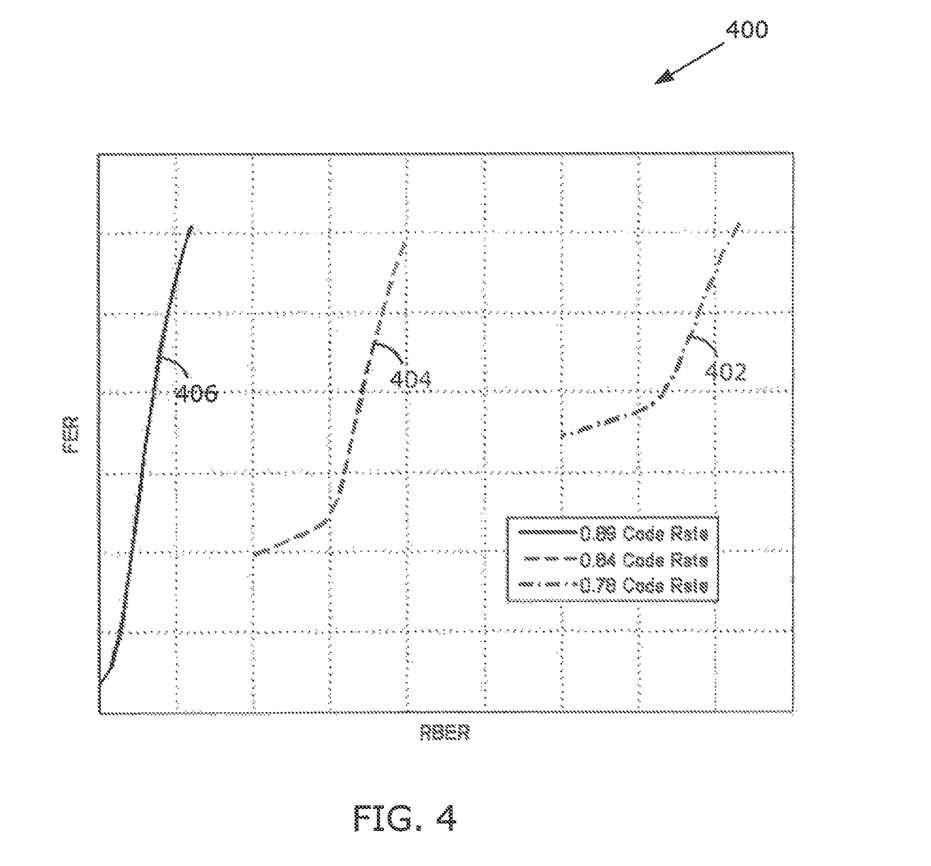
FIG. 4 is a graph illustrating decoder performance for various code rates.

Such error floors can be caused by trapping sets or by arithmetic or numeric limitations within an LDPC decoder. For power and area reasons, practical LDPC decoders generally operate using finite precision arithmetic elements, leading to Numerically Induced Floors (NIF) in the FER performance curves for the decoder. Low-rank columns (column weight 2 or less) are particularly susceptible to NIF errors since they have one or two check nodes that are contributing information to help resolve the state of a bit in such a column. In addition, the more low-rank columns in a code, the more opportunities for NIF to form as shown in the Graph 400 of FIG. 4. The code rate decreases by dedicating more parity, and hence more low rank columns, to the encoded data and in the process more numerically induced errors are generated as observed as the flooring between the 0.89 code rate LDPC code and successively lower rate codes.

In a FEC block that fails to decode due to NI issues there are generally one or two bit errors in the data portion (high or full rank) of the FEC block and 2 or more bit errors in the parity (low rank) section of the codeword.

The present disclosure includes a description of an enhancement to iterative decoding FEC methods that, in some embodiments, can significantly improve error floor performance of the decoder. In particular, the present disclosure presents a method as implemented within an LDPC decoder, which is a commonly used FEC method used in modern communications systems.

To provide a context for some of the embodiments disclosed herein, the present disclosure describes the major operational elements of a Layered LDPC decoder. The Boost Floor Mitigation (BFM) method is described and several embodiments within the context of a Layered LDPC decoder are presented. In general terms, BFM adds some gain to the outputs of Check Nodes within low rank columns once a floor condition has been detected. In various embodiments, this change to the Layered Processing engine efficiently corrects Numerically Induced Floors in finite-precision LDPC decoders.

Figure 5:
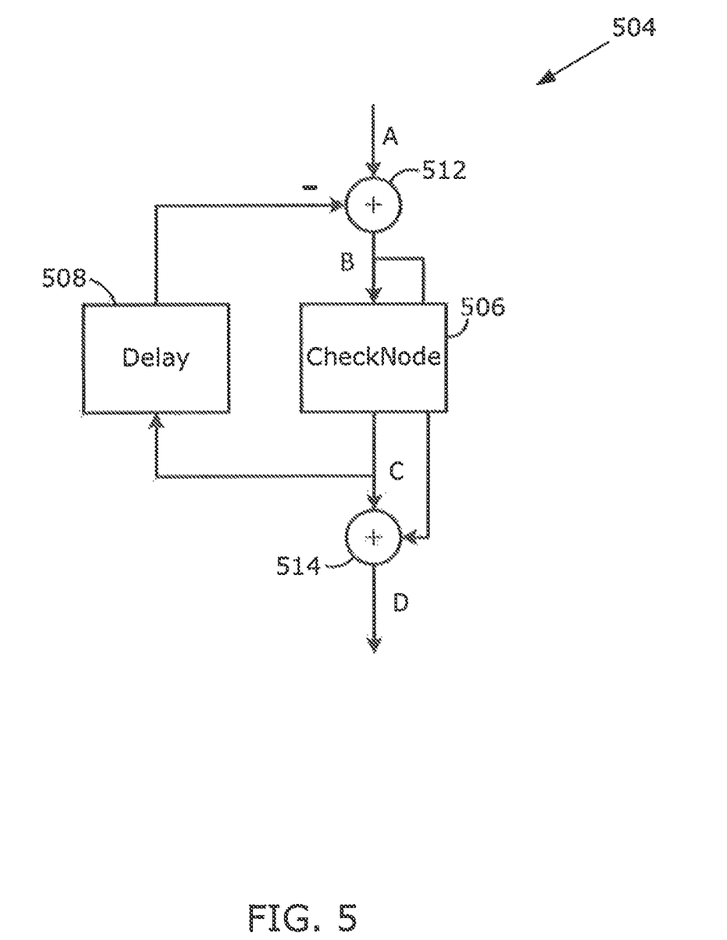
FIG. 5 is a block diagram of a typical Layer Processor.

The layered decoding processes one layer at a time, updating both the check node and variable node values in a single cycle. FIG. 5 illustrates a block diagram of a typical Layer Processor 500.

In the processor of FIG. 5, point A is the summation of the channel and all extrinsic values for a given column C in the QC-H matrix, that is $A=V_C(t)$. The subtractor at adder 512 between point A and point B removes the extrinsic information for the row currently being operated on. Point B is the channel plus the extrinsic information for all rows except the row currently being operated on and can be defined by the formula $B(t)=V_C(t)-C_{C,r}(t)$ where $C_{C,r}(t)$ is the check node output of the previous cycle. Effectively this calculation ensures that the input to a check node does not contain any information from itself from a previous layer; even check nodes should not talk to themselves. The check node output, point C, is calculated based on the following equation:

$$C_{C,r}(t+1)=f(\min_{j\neq r} \text{Equation}_{C,r}(t)) \text{Checknode update equation for point C}$$

Where $f$ is an approximation of belief propagation function and where $0<j\leq N_C$ and $j\neq r$. Common approximation functions include minsum adjust and attenuated minimum or others as found in literature (see e.g. Ryan et al. as well as Error Control Coding, S. Lin and D. J. Costello Jr, Pearson Press, 2004, incorporated herein by reference in its entirety). A typical attenuation factor setting, for example, is 0.75. The output of the layer processor after adder 514, point D, is the channel plus the extrinsic information for all rows except the row currently being operated on plus the updated extrinsic information for the row being processed and is defined by the formula $D(t+1)=V_C(t)-C_{C,r}(t)+C_{C,r}(t+1)$. The delay element stores the updated extrinsic information for this column and row and saves it for the next time this column is processed to form the data at point B.

In practical implementations of LDPC decoders, the LLRs (log-likelihood ratios) at all nodes within the device are configured to be fixed-precision elements. The nature of LDPC decoding benefits from very high dynamic ranges of operation but to limit area and power consumption of commercial implementations fixed precision values are generally selected. The precision limits for nodes within the LDPC decoder are selected so that the decoder exhibits FER performance that approaches ideal. Each particular application and design generally selects the precisions to trade off performance and power, the lower the precision the worse the FER performance but the smaller the decoder area and power consumption.

Finite-precision LDPC decoders are susceptible to Numerically Induced (NI) floors. In some applications the presence of these floors is acceptable and need not be corrected. In many modern applications (OTN, Memory devices etc.) stringent requirements are placed on the location of such error floors. One method to correct such issues is to increase the precision of the nodes within the LDPC decoder but this increases area (cost) and power consumption. A more efficient method is required to keep implementation cost down while still operating without any NI floors.

Figure 6A:
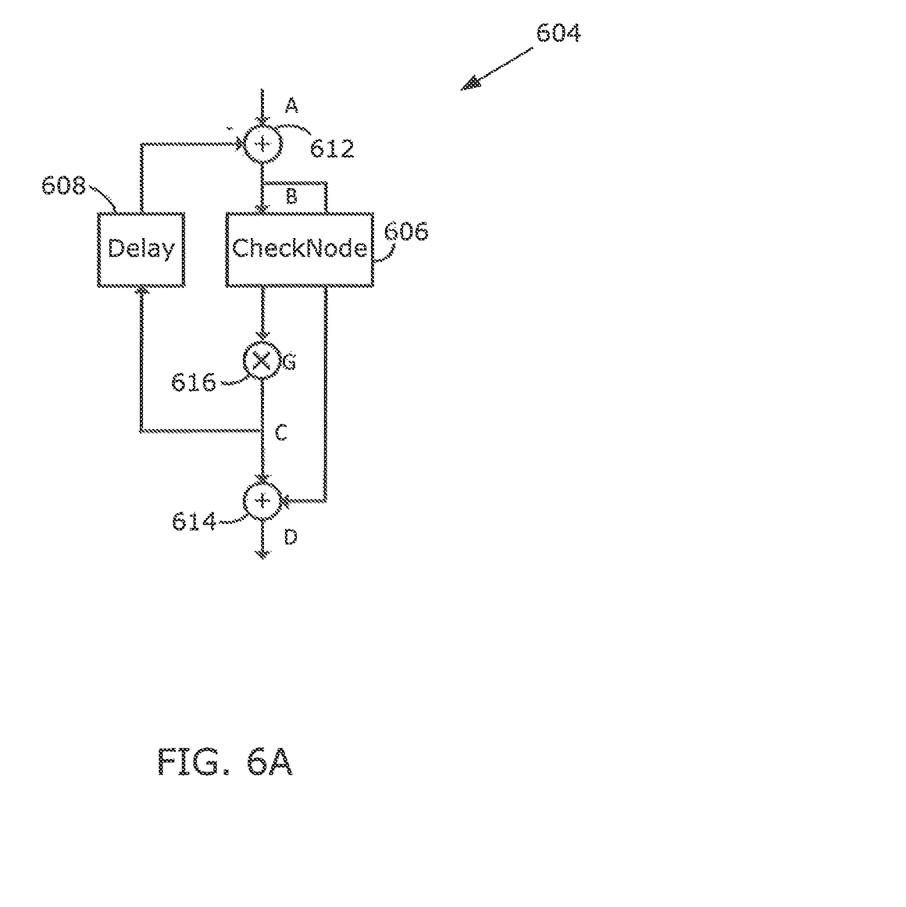
FIG. 6A is a block diagram illustrating a Layered LDPC decoder, according to an embodiment of the present disclosure.

Reference is now made to FIG. 6A, which illustrates a block diagram of a Layered LDPC decoder 604, according to an embodiment of the present disclosure. To enable BFM within the context of a Layered LDPC decoder a gain element 616 is placed just below the output of the Check Node 606 operation as shown in FIG. 6A. The gain (G) of Gain element 616 can be set to any value, nominally between 1.5 and 2.25 to obtain good results. In an embodiment, the Gain element 616 is only applied on columns in the check node that are less than full rank column weight. In some practical embodiments, only the Parity columns in the H matrix meet this condition. In an embodiment, a gain of exactly 2 is selected in the normative realization of the check node for its ease of implementation and simple arithmetic properties. Decoder 604 also comprises delay element 608 and adders 612 and 614.

Figure 6B:
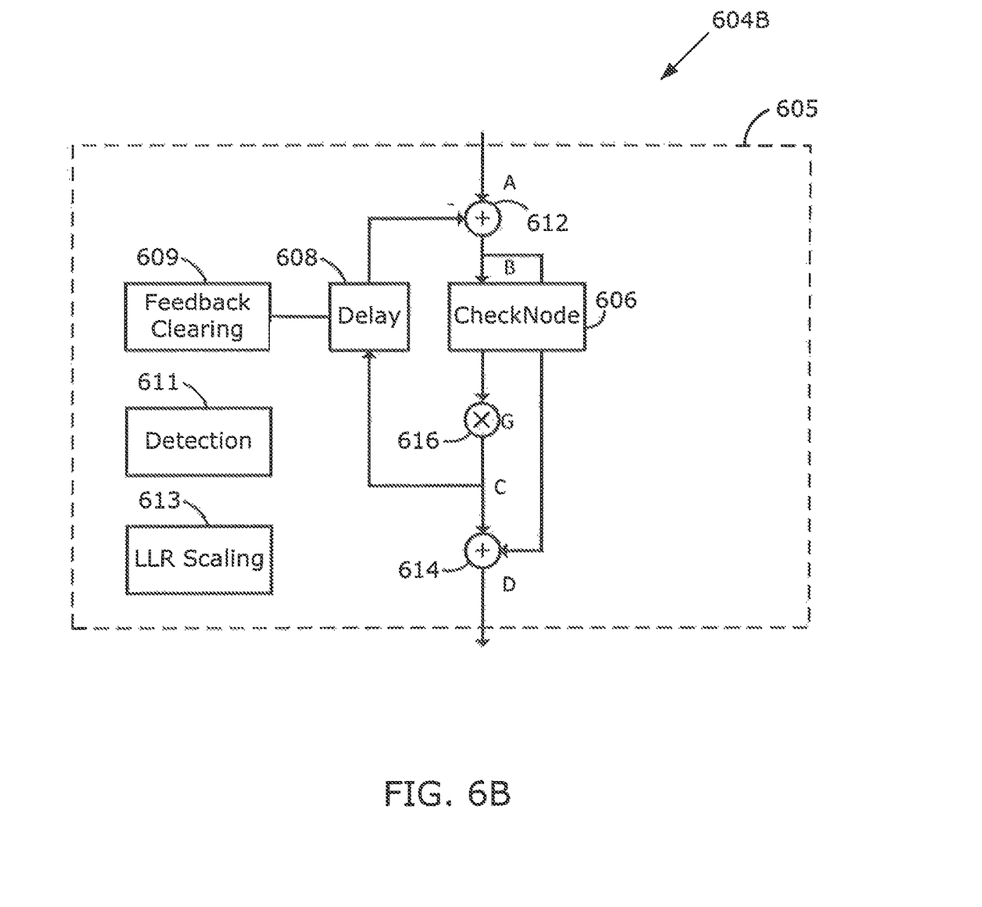
FIG. 6B is a block diagram illustrating a Layered LDPC decoder, according to an embodiment of the present disclosure.

FIG. 6B illustrates a block diagram of a Layered LDPC decoder 604B according to the present disclosure similar to the decoder of FIG. 6A but showing additional components. The embodiment of FIG. 6B is shown with a processor 605 comprising feedback clearing element 609 coupled to delay element 608, a detection element 611 for detecting a floor error condition, and a Log Likelihood Ratio (LLR) scaling device 613 to scale down a current LLR state in a FEC block. Feedback clearing element 609 may be configured to clear the delay element when a floor error condition has been detected. Processor also comprises check node 606, delay element 608, adders 612 and 614, and gain element 616.

In many LDPC architectures the delay element of the layered processor stores minimal information at the output of a Check node. For example, a check node will generate an individual output for each of the M inputs of the check node, where M is typically in the range from 16 to 80 elements. The output of the check nodes only take on one of two different values and an individual sign bit for each column. The two possible output values are derived from the minimum absolute value of the input signals and the second minimum absolute value. To minimize storage in the delay element only the minimum LLR value, the $2^{nd}$ minimum LLR value, the index of the minimum value and the sign of each of the outputs is stored. This significantly reduces the area of the Delay element in any practical LDPC decoder versus storing the fully formed output value for each check node output. By modifying specific check node outputs, specifically the low-rank column weight outputs, this code would necessitate an increase in storage space for the Delay element to account for the scaling.

Figure 7:
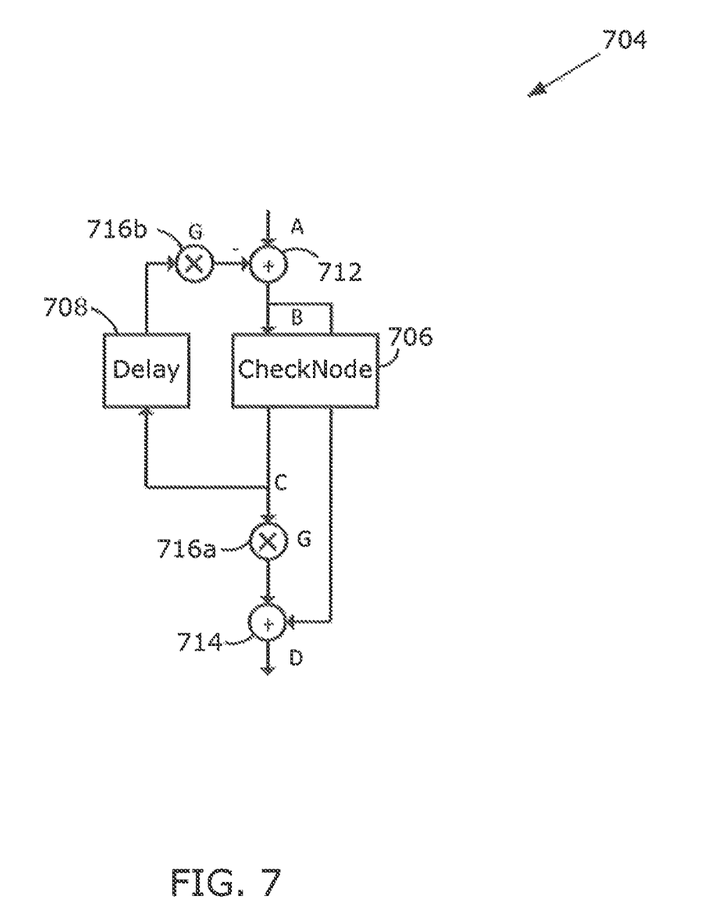
FIG. 7 is a block diagram illustrating a Layered LDPC decoder, according to another embodiment of the present disclosure.

To account for this inherent structure within the decoder, some embodiments disclosed herein utilize the modified structure shown in FIG. 7. FIG. 7 illustrates a block diagram of a Layered LDPC decoder 704, according to an embodiment of the present disclosure. In the embodiment illustrated in FIG. 7, the Delay feedback element 708 is unchanged from a standard layered decoder. The boost gain in two places (716a and 716b), once just prior to the final adder 714 and once again at the output of the delay element before the first adder 712. The functionality of BFM remains unchanged and the feedback storage of the layered processor maintains its small efficient size.

Figure 8:
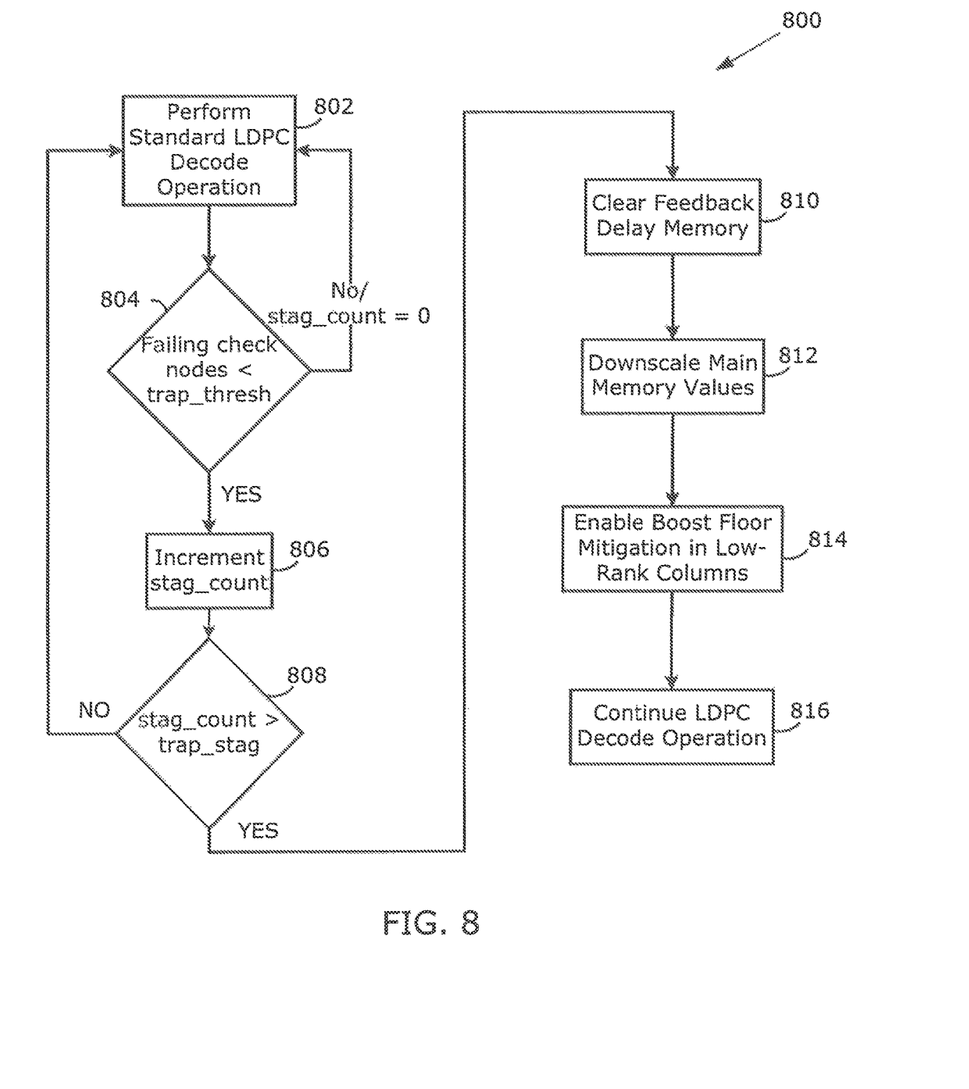
FIG. 8 is a flow chart diagram illustrating a decoding method, according to an embodiment of the present disclosure.

Generally, Boost Floor Mitigation works best when activated after a floor error condition has been detected. This allows the normal operation of the decoder to continue unaffected by BFM until the method is required. Detecting a flooring condition is fairly simple since a floored codeword has few remaining bits in error, which can be detected by observing the failing check node count, but the decoder is simply unable to solve the final few equations to complete the operation. Reference is now made to FIG. 8, which is a flow chart diagram illustrating the process for floor detection and boost floor mitigation.

At 802, a LDPC decode operation is performed. In various embodiments, the operation performed is a standard LDPC Decode operation.

At 804, 806, and 808 it is determined whether a floor condition has occurred. In some embodiments, detection of a floor condition is performed by keeping track of the number of failing (odd parity) check nodes in the graph as the iterative decoding procedure is in operation. In an embodiment, a trap condition is not declared until a number of layers have a number of failing check nodes below the trap_thresh threshold. The number of layers of "stagnation" required before a trap condition is declared is determined by the parameter stag_count. In an embodiment, stag_count is set to 6 layers. If a condition occurs in which convergence is very close (failing check nodes are below trap_thresh) for a number of layers (stag_count=6) then it can be said that the decoder is "trapped". Accordingly, if at 804 it is determined that the number of failing check nodes falls below a threshold (trap_thresh), then at 806, the number of consecutive layers (stag_count) for which the failing check nodes are below the threshold are counted. At 808, it is determined whether the value counted at 806 has exceeded a stagnancy parameter. If yes, then a flooring condition is triggered. In the embodiment illustrated in FIG. 8, the stagnancy parameter is defined by trap_stag. In some embodiments, typical settings for trap_thresh would be 1-2% of the check nodes in the graph and trap_stag would be set to between 1 and 2 decoder iterations. Different codes and LDPC decoder designs may require different settings for these trap detection parameters. Accordingly, in various embodiments these parameters are configurable in any practical design.

Once a trap has been detected, all the feedback delays in the Layered processor are cleared at 810. In addition, at 812, all of the stored values in the main memory are scaled down. In an embodiment, the stored values are scaled by a power of 2, such as, for example, 4. In some embodiment, the power of two scaling is used to reduce hardware costs given that scaling by a power of two can be accomplished simply by a right shift in binary. By performing the right shift, all the LLRs in the main memory are lowered but the signs are kept intact. In an embodiment, the trap condition occurs when a particular bit or few bits are stuck at high values but with the wrong sign. At 814, BFM is enabled on the low-rank columns. Low-rank columns are those columns in the H matrix of the LDPC code that only have one or two entries. These low rank columns are seen in the parity sections of many standard LDPC codes. For low code rates, there can be many low-rank columns. For example, in an embodiment, N row codes are used where N−2 columns of parity are degree 2. Low rank columns are generally more susceptible to being trapped than higher rank columns. At 816 processing of the FEC block is continued.

Figure 9:
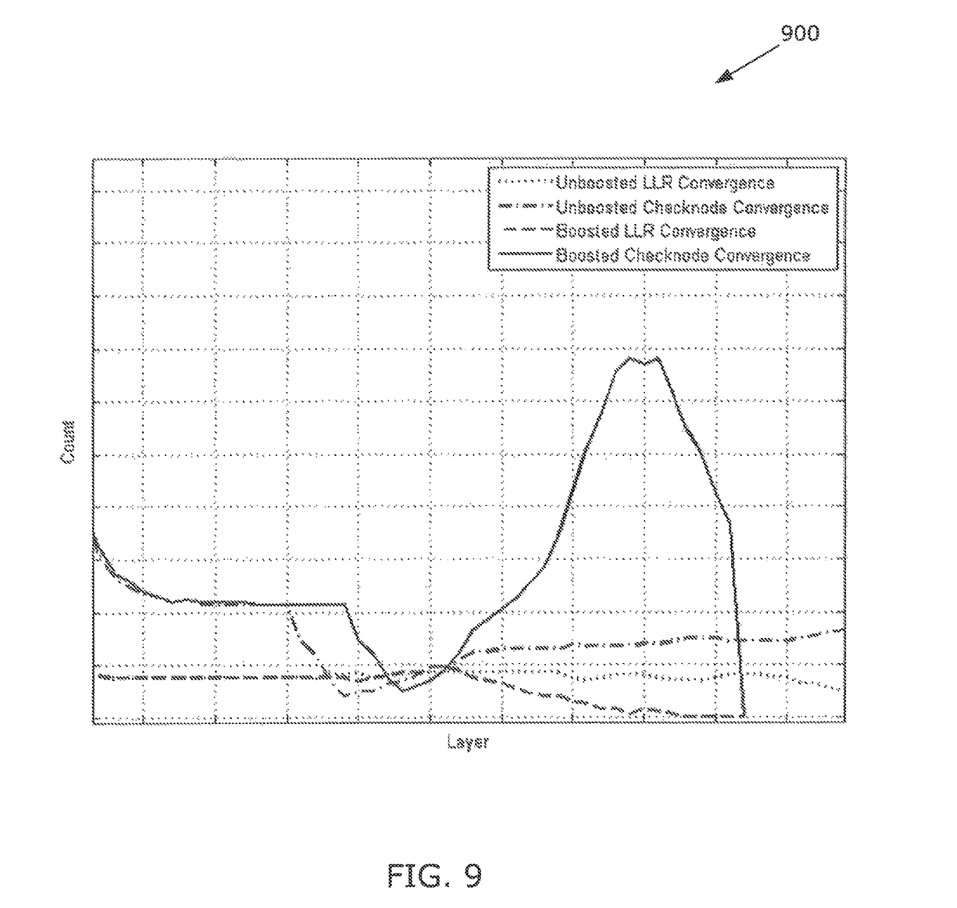
FIG. 9 is a graph illustrating the convergence plot for an LDPC decoder implementation, according to an embodiment of the present disclosure.

Reference is now made to FIG. 9, which illustrates a graph 900 showing the convergence plot for an LDPC decoder implementation, according to an embodiment of the present disclosure. The Y-axis represents the current number of check nodes that are failing and the X-axis shows the current layer count within the iterative decoder. In an embodiment, the check node convergence values are measured in the LDPC decoder by counting the number of check nodes that have odd parity while the LLR convergence lines show the number of remaining bit-errors in the FEC block. In an embodiment, the LLR convergence lines are derived by comparing the internal FEC block after each layer in the LDPC decoder with the known error-free FEC block to count the number of remaining errors and as such these curves are shown for information purposes only. For the FEC block corresponding to FIG. 9, the Boosted LLR convergence method recovers the FEC block while the un-boosted method cannot recover the block. FIG. 9 also shows the long period of stagnation leading into the activation of BFM and that after activation the number of remaining bit-errors in the block begins improving soon after boost floor mitigation is enabled.

Figure 10:
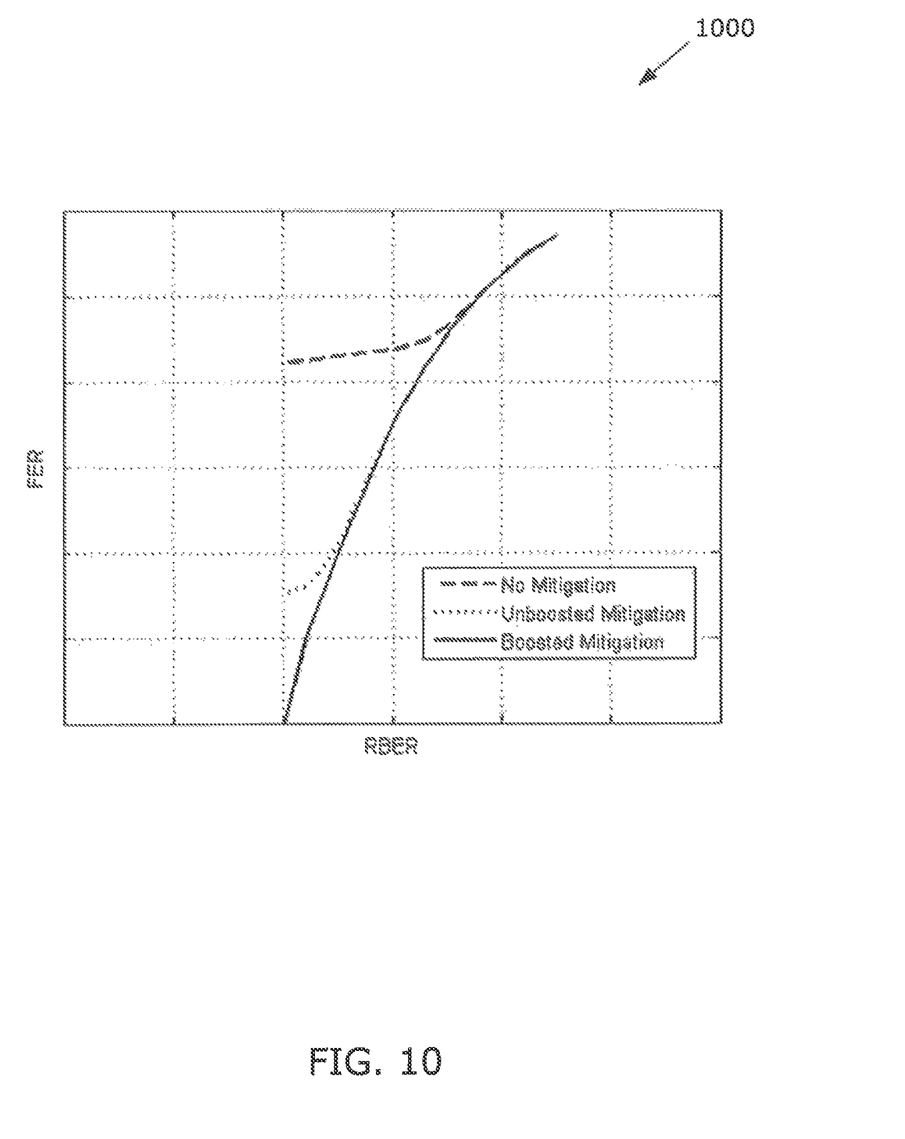
FIG. 10 is a graph illustrating the operation of boost floor mitigation in terms of its effect on FEC performance, according to an embodiment of the present disclosure.

Reference is now made to FIG. 10, which illustrates a graph 1000 showing the operation of BFM in terms of its effect on FEC performance. For the example illustrated in FIG. 10, we consider a low-rate (0.75) code with many low-rank columns operating with a constrained arithmetic LDPC decoder. The resulting error floor is unacceptably high, with all of the unacceptable error packets being Numerically Induced. If one were to simply reset the memory and clear the feedback elements before continuing decoding (as is often done) one would see a significant improvement in error floor performance but the frame error floor is still present. If the Boost Floor Mitigation is enabled, then the error floor is completely removed. In the inventors' testing, the BFM method has never failed to recover a FEC block that failed due to numerically induced frame errors.

Many of the embodiments described herein have various advantages. For example, various of the above-described embodiments achieve improved error floor performance for any LDPC code.

In various embodiments, Boost Floor Mitigation does not require detailed pre-knowledge of the H matrix, only the column node order must be understood.

In various embodiments, Boost Floor Mitigation is applicable to any finite precision LDPC decoder implementation. In some embodiments, floor area FER performance of Layered or flood-filling decoders would both benefit from this invention.

In various embodiments, Boost Floor Mitigation can be used over a wide range of Code rates and can be used within fully programmable code decoders.

In various embodiments, the application of BFM lowers the requirement for implementing a decoder with a high-fidelity arithmetic element. Accordingly, in some embodiments, with BFM in place, a much smaller area can be used and more power efficient LDPC decoder can result.

In many communication systems error floor performance is a critical factor. BFM can lower the error floor in a cost efficient manner. For example, some of the embodiments described herein utilize less Encoder/Decoder area and require less power consumption and less engineering time.

Boost Floor Mitigation can be applicable in other iterative decoding soft decoding FEC.

In this disclosure, a novel method for resolving Numerically Induced error floor conditions within iterative FEC decoders has been presented. Various embodiments, of the Boost Floor Mitigation method do not impact standard convergence of the decoder and can be used to effectively resolve NI error floor conditions. Many of the embodiments of the BFM method and operation have been presented within the context of a Layered LDPC decoder; however, other implementations are possible.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. An Error Correction Code (ECC) decoder including at least one processor, the at least one processor comprising:
    a detection element for detecting a floor error condition;
    a check node circuit element;
    a delay element coupled in a feedback loop with the check node element;
    a first gain element coupled to an output of the check node element, the gain element being enabled when the detection element has detected a floor error condition;
    a feedback clearing element coupled to the delay element, the feedback clearing element configured to clear the delay element when a floor error condition has been detected; and
    a Log Likelihood Ratio (LLR) scaling device to scale down a current LLR state in a FEC block.

2. The decoder of claim 1, wherein the first gain element is enabled only for low rank columns of an H matrix, a low rank column being a column having a weight of 2 or less.

3. The decoder of claim 1, wherein the processor comprises a layered processor.

4. The decoder of claim 1, wherein the ECC code is a Low Density Parity Check (LPDC) code.

5. The decoder of claim 3, further comprising:
    a memory element for storing a full FEC block to be processed;
    a plurality of shift processors for performing a circulant shift operation specified by an H matrix;
    wherein the layered processor comprises a plurality of layered processors, each layered processor further comprising:
        a port for receiving a value from a column in the H matrix;
        a subtractor coupled to the port, the subtractor configured to remove previous extrinsic information for a layer from a value received from the H matrix, an output of the subtractor being coupled to an input of the check node circuit element;
        an adder for combining the check node input and an output of the check node;
        wherein the delay element stores the check node output for use in a subsequent iteration.

6. The decoder of claim 5, wherein the first gain element is coupled between the output of the check node element and an input of the adder; and wherein an input of the delay element is coupled to an output of the first gain element.

7. The decoder of claim 5, wherein the first gain element is coupled between the output of the check node element and an input of the adder; and wherein an input of the delay element is coupled to the output of the check node element.

8. The decoder of claim 7, further comprising a second gain element between an output of the delay element and an input of the subtractor.

9. The decoder of claim 8, wherein the first gain element is enabled only for low rank columns of the H matrix, a low rank column being a column having a weight of 2 or less.

10. The decoder of claim 1, wherein the detection element is configured to:
    count a number of failing check nodes;
    when the number of failing check nodes falls below a first threshold, count a number of consecutive layers the failing checknodes are below the first threshold; and
    determine that a floor error condition has occurred when the number of counted consecutive layers is above a second threshold.

11. The decoder of claim 10, wherein the decoder is configured to downscale Log Likelihood Ratio (LLR) values stored in a main memory of the decoder when a floor error condition has occurred.

12. A method for boost floor mitigation during a decoding operation performed by a decoder, the method comprising:
   monitoring for a floor error condition while performing the decoding operation;
   if a floor error condition has been detected, then:
      clearing a feedback delay memory in the decoder;
      downscaling Log Likelihood Ratio (LLR) values stored in a main memory of the decoder;
      applying a gain in low-rank columns; and
      continuing to perform the decoding operation.

13. The method of claim 12, wherein the decoding operation is an Error Correction Code (ECC) decoding operation.

14. The method of claim 13, wherein the ECC code comprises a Low Density Parity Check (LPDC) code.

15. The method of claim 12, wherein monitoring for a floor error condition comprises:
   counting a number of failing check nodes;
   when the number of failing check nodes falls below a first threshold, counting a number of consecutive layers the failing checknodes are below the first threshold; and
   determining that a floor error condition has occurred when the number of counted consecutive layers is above a second threshold.

* * * * *